(12) United States Patent
Mirican et al.

(10) Patent No.: US 9,230,682 B2
(45) Date of Patent: Jan. 5, 2016

(54) METHOD AND SYSTEM FOR AUTOMATED DEVICE TESTING

(71) Applicant: Broadcom Corporation, Irvine, CA (US)

(72) Inventors: Baruyr Mirican, Irvine, CA (US); Tyler Tolman, Laguna Niguel, CA (US); Jeffrey Brueggeman, Mission Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 218 days.

(21) Appl. No.: 13/727,036

(22) Filed: Dec. 26, 2012

(65) Prior Publication Data

US 2014/0177363 A1    Jun. 26, 2014

(51) Int. Cl.
| | |
|---|---|
| *G11C 7/00* | (2006.01) |
| *G11C 29/02* | (2006.01) |
| *G11C 29/14* | (2006.01) |
| *G11C 29/56* | (2006.01) |

(52) U.S. Cl.
CPC ............... *G11C 29/02* (2013.01); *G11C 29/14* (2013.01); *G11C 29/56012* (2013.01)

(58) Field of Classification Search
CPC .......... G01R 31/306; G01R 31/31905; G01R 31/31908; G01R 31/31912; G01R 31/31919
USPC ........................................................ 365/201
See application file for complete search history.

(56) References Cited

U.S. PATENT DOCUMENTS

| | | | |
|---|---|---|---|
| 6,291,265 B1 * | 9/2001 | Mess .............................. 438/107 |
| 6,392,428 B1 * | 5/2002 | Kline et al. .............. 324/754.18 |
| 6,677,776 B2 * | 1/2004 | Doherty et al. .......... 324/750.25 |
| 6,782,611 B2 * | 8/2004 | Samaras et al. ................. 29/840 |
| 6,822,469 B1 * | 11/2004 | Kline ........................ 324/750.05 |
| 6,967,494 B2 * | 11/2005 | Kline ........................ 324/754.18 |
| 7,036,218 B2 * | 5/2006 | Pierce .............................. 29/842 |
| 7,138,818 B2 * | 11/2006 | Chong et al. ............. 324/754.18 |
| 7,282,932 B2 * | 10/2007 | Kirby et al. .............. 324/756.04 |
| 7,444,253 B2 * | 10/2008 | Mathieu ........................ 702/108 |
| 7,533,457 B2 * | 5/2009 | Foehringer et al. ............. 29/825 |
| 7,557,596 B2 * | 7/2009 | Eldridge et al. .......... 324/750.3 |
| 7,579,848 B2 * | 8/2009 | Bottoms et al. .......... 324/756.03 |
| 7,873,874 B2 * | 1/2011 | Choate et al. .................... 714/45 |
| 7,910,385 B2 * | 3/2011 | Kweon et al. ................... 438/18 |
| 8,159,244 B2 * | 4/2012 | Vaccani ................... 324/754.01 |
| 8,245,392 B2 * | 8/2012 | Antesberger et al. .......... 29/846 |
| 8,384,411 B2 * | 2/2013 | Mooyman-Beck et al. ......................... 324/762.02 |
| 8,659,750 B2 * | 2/2014 | Masuda ......................... 356/72 |
| 8,816,709 B2 * | 8/2014 | Shiozawa ................ 324/750.23 |
| 8,928,343 B2 * | 1/2015 | Sellathamby et al. ... 324/754.01 |
| 8,987,896 B2 * | 3/2015 | Cheah et al. .................. 257/724 |
| 2003/0226074 A1 * | 12/2003 | Ohlhoff et al. ................ 714/718 |

(Continued)

*Primary Examiner* — Viet Q Nguyen

(74) *Attorney, Agent, or Firm* — Sterne, Kessler, Goldstein & Fox P.L.L.C.

(57) ABSTRACT

Embodiments described herein provide enhanced testing of devices. For example, in an embodiment, an interposer for testing devices is provided. The interposer includes a substrate, a first plurality of connection elements located on a surface of the substrate, and a memory device electrically coupled to the first plurality of connection elements through the substrate. The first plurality of connection elements are configured to mate with a second plurality of connection elements located on a device under test. The memory device is configured to store information received from the device under test and to output stored information to the device under test.

16 Claims, 10 Drawing Sheets

(56) References Cited

U.S. PATENT DOCUMENTS

| | | |
|---|---|---|
| 2008/0309349 A1* | 12/2008 | Sutono .......................... 324/537 |
| 2013/0159587 A1* | 6/2013 | Nygren et al. ................ 710/306 |
| 2014/0084954 A1* | 3/2014 | Wig ........................ 324/756.02 |
| 2014/0197409 A1* | 7/2014 | Partsch .......................... 257/48 |

\* cited by examiner

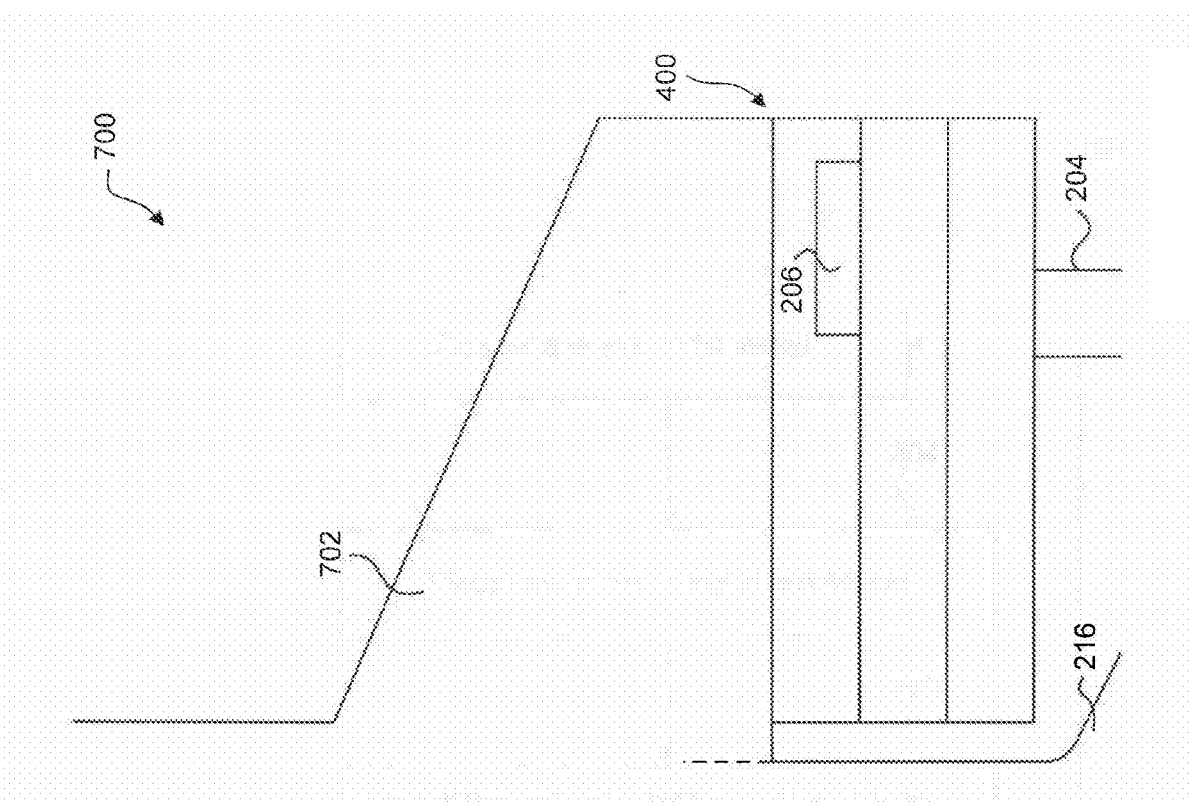
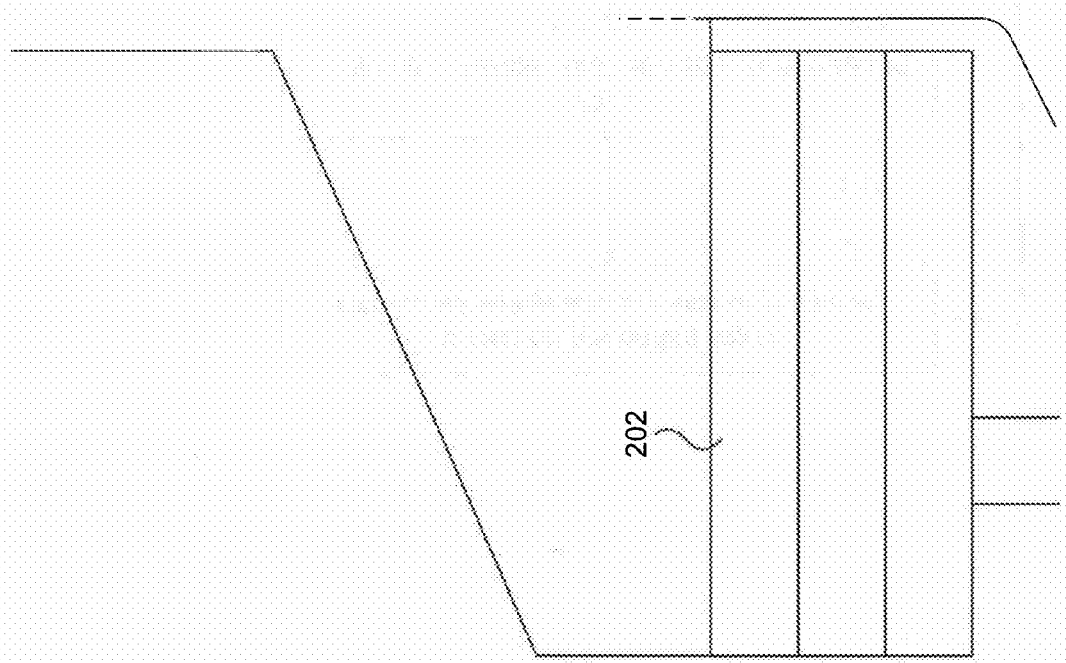
FIG. 7

METHOD AND SYSTEM FOR AUTOMATED DEVICE TESTING

BACKGROUND

1. Field

Embodiments described herein generally relate to systems and methods for testing electrical devices.

2. Background

Package-on-package (POP) devices include two or more packaged devices (e.g., integrated circuit (IC) devices) stacked on top of one another. In one example, a POP device can include a memory stacked on top of a memory controller. In such an example, the memory controller controls access to the memory device stacked on top of it. For example, the POP device including the memory and memory controller can be mounted on to a printed circuit board (PCB), which can electrically couple the POP device to other devices mounted on it. In such an example, the memory controller can regulate how other components store and retrieve information from the memory.

In a POP device, at least one of the stacked devices typically includes connection elements on at least two surfaces. For example, for a memory stacked on a memory controller, the memory controller can include connection elements on its top surface (to communicate with the memory) and on its bottom surface (to communication with a PCB). Thus, when the memory controller is tested, communications with both the top and bottom sets of connections elements must be tested.

One approach for testing a memory controller having connection elements on both its top and bottom surfaces is to use an actuator to physically acquire the memory controller. The actuator physically places the memory controller into a socket of a device interface board (DIB). The socket establishes electrical connections with the memory controller's bottom surface connection elements. The top surface connection elements can be routed to the DIB through the actuator. To test the interaction of the memory controller with a memory, the DIB can emulate the operation of a memory.

The emulation approach to testing the memory controller suffers from a number of drawbacks. First, the emulation provided by the DIB is relatively slow compared to memories with which the memory controller will be used. Thus, emulation often does not accurately mimic real world operation and it requires more testing time than if testing was conducted using an actual memory. Also, the emulation approach requires relative long signal paths from the top surface connection elements to the DIB, Because of signal integrity issues associated with those long paths, the emulation approach often only uses DC testing schemes.

BRIEF DESCRIPTION OF THE DRAWINGS/FIGURES

The accompanying drawings, which are incorporated herein and form a part of the specification, illustrate the disclosed subject matter and, together with the description, further serve to explain the principles of the contemplated embodiments and to enable a person skilled in the pertinent art to make and use the contemplated embodiments.

FIG. 7 shows a cross-sectional diagram of an actuator, according to an embodiment.

Figure 1:
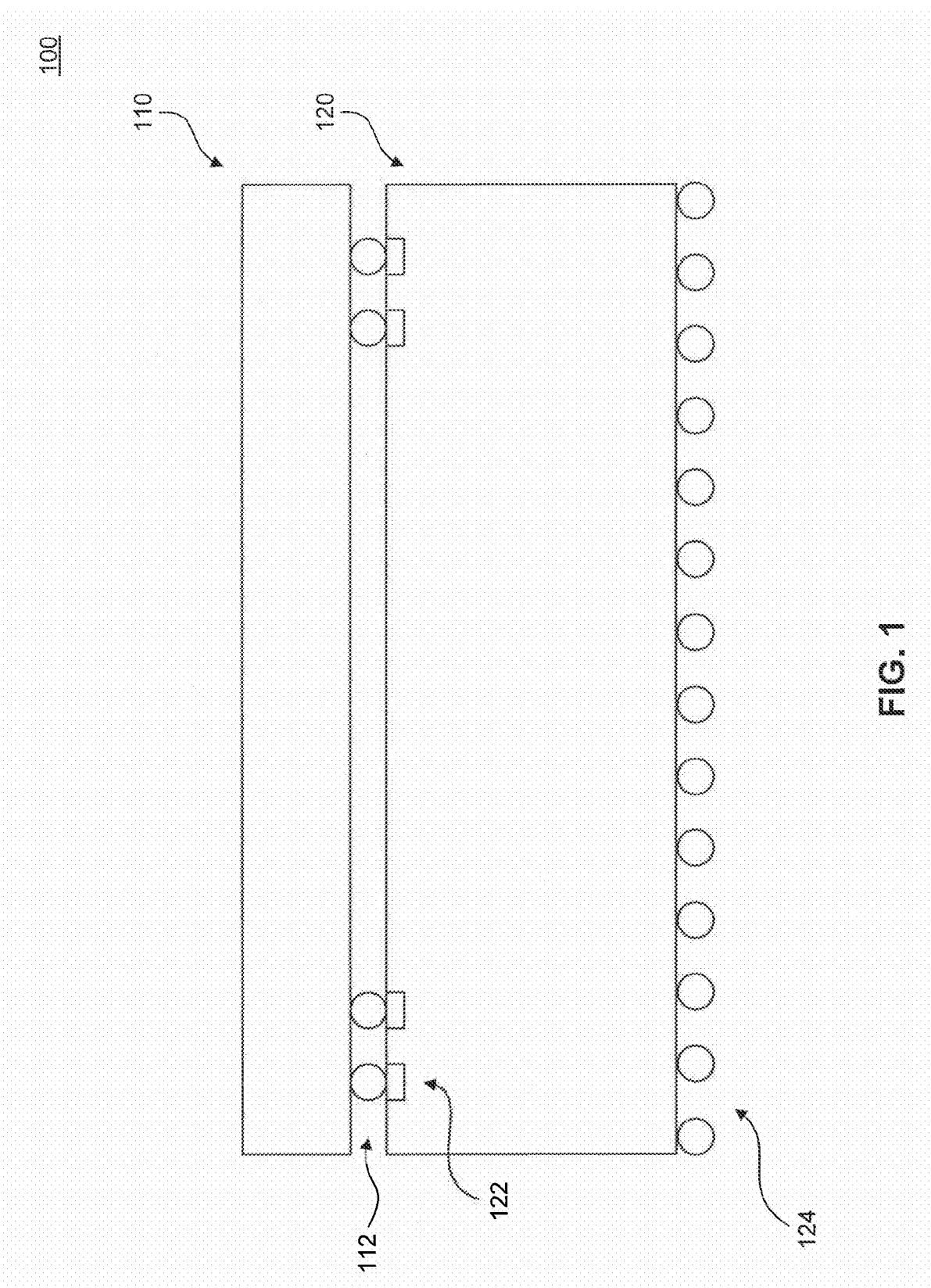
FIG. 1 shows a cross-sectional diagram of a package-on-package (POP) device.

The disclosed subject matter will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

I. Overview

The following Detailed Description refers to accompanying drawings to illustrate exemplary embodiments consistent with the disclosure. References in the Detailed Description to "one exemplary embodiment," "an exemplary embodiment," "an example exemplary embodiment," etc., indicate that the exemplary embodiment described can include a particular feature, structure, or characteristic, but every exemplary embodiment can not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art(s) to affect such feature, structure, or characteristic in connection with other exemplary embodiments whether or not explicitly described.

The exemplary embodiments described herein are provided for illustrative purposes, and are not limiting. Other exemplary embodiments are possible, and modifications can be made to the exemplary embodiments within the spirit and scope of the disclosure. Therefore, the Detailed Description is not meant to limit the disclosure. Rather, the scope of the disclosure is defined only in accordance with the following claims and their equivalents.

Embodiments of the disclosure can be implemented in hardware, firmware, software, or any combination thereof. Embodiments of the disclosure can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include non-transitory machine-readable mediums such as read only memory (ROM); random access memory (RAM); magnetic disk storage media; optical storage media; flash memory devices; and others. As another example, the machine-readable medium can include transitory machine-readable medium such as electrical, optical, acoustical, or other forms of propagated signals (e.g., carrier waves, infrared signals, digital signals, etc.). Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

The following Detailed Description of the exemplary embodiments will so fully reveal the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein may be spatially arranged in any orientation or manner.

Embodiments described herein provide enhanced testing of devices. For example, in an embodiment, an interposer for testing devices is provided. The interposer includes a substrate, a first plurality of connection elements located on a surface of the substrate, and a memory device electrically coupled to the first plurality of connection elements through the substrate. The first plurality of connection elements are configured to mate with a second plurality of connection elements located on a device under test. The memory device is configured to store information received from the device under test and to output stored information to the device under test.

In another embodiment, a system for testing devices is provided. The system includes an actuator having an interposer and a device interface board. The interposer includes a substrate, a first plurality of connection elements located on a surface of the substrate, and a memory device electrically coupled to the first plurality of connection elements through the substrate. The first plurality of connection elements are configured to mate with a second plurality of connection elements located on a device under test. The device interface board includes a test socket configured to receive the device under test and a controller electrically coupled to the test socket. The controller is configured to control the device under test to store information in the memory and to output stored information received from the memory.

In still another embodiment, a method of testing a device is provided. The method includes receiving the device at a socket of a device interface board, the device being transported to the socket using an actuator, controlling the device to output a value stored in a memory, the memory being located in the actuator, and determining if the device is functional based on the value output by the device.

II. Introduction

FIG. 1 shows a cross-sectional diagram of a package-on-package (POP) device 100. POP device 100 includes a first device 110 and a second device 120. In some implementations, first device 110 and/or second device 120 can house IC dies that implement various types of functionality. For example, in one implementation, first device 110 can be a high-speed memory device and second device 120 can be a memory controller. In another implementation, first device 110 can be specialized hardware, e.g., a field programmable gate array (FPGA), and second device 120 can be a microprocessor. In still another implementation, second device 120 can be a microprocessor and first device 110 can be a local memory for second device 120. Those skilled in the relevant art will recognize that the above listed implementations are provided as examples and are not intended to be limiting.

In the implementation shown in FIG. 1, first and second devices 110 and 120 are approximately the same size in at least one direction. Those skilled in the art will appreciate that this example is not intended to be limiting. For example, in alternate embodiments, first device 110 may be smaller than second device 120 all directions.

First device 110 includes a plurality of connection elements 112. In the implementation shown in FIG. 1, plurality of connection elements 112 are solder balls. In alternate implementations, however, other types of connection elements can be included in plurality of interconnection elements 112, e.g., pads or pins.

Second device 120 includes plurality of connection elements 122. In the implementation shown in FIG. 1, plurality of connection elements 122 are pads. In alternate implementations, however, plurality of connection elements 122 can include other types of connection elements, e.g., solder balls or pins.

Pluralities of connection elements 112 and 122 facilitate communication between first and second devices 110 and 120. For example, in the implementations in which first device 110 is a memory and second device 120 is processor (e.g., a memory controller), second device 120 can store information in first device 110 and request stored information from first device 110 (e.g., in response to requests from other devices).

Second device 120 also includes a plurality of connection elements 124. In one example, plurality of connection elements 124 facilitate communication between POP device 100 and other devices. For example, POP device 100 can be mounted on a printed circuit board (PCB) alongside other devices. In such an implementation, plurality of connection elements 124 can facilitate communications between POP package 100 and the PCB. The PCB, in turn, can facilitate communications with other devices, e.g., through traces and/or vias of the PCB. In the implementation shown in FIG. 1, plurality of connection elements 124 is shown to be a plurality of solder balls. In other implementations, however, plurality of connection elements 124 can include other types of connection elements, e.g., pads or pins.

A number of different approaches for testing POP packages such as POP package 100 have been used. For example, in one approach, POP device 100, with first and second devices 110 and 120 joined as shown in FIG. 1, can be tested as a whole. Although this type of testing very closely simulates real world use of POP device 100, it can be relatively expensive. This is because if an error is detected, POP device 100 is discarded even though the error may be attributable to only one of first and second devices 110 and 120.

In another approach, first and second devices 110 and 120 can be tested separately. For example, second device 120 can be placed in a test socket of a device interface board (DIB) by an actuator and tested using a controller that sends signals to second device 120. In this approach, signals output by plurality of connection elements 122 can be routed back to the DIB using the actuator. Because of the long signal paths through the actuator, this type of testing typically only allows for DC testing, as opposed to high frequency testing. Moreover, this type of testing also requires a relatively large number of resources on the DIB because signals both from plurality of connection elements 122 and from plurality of connection elements 124 must be routed.

In the example in which top first device 110 is a memory device, the DIB can be configured to emulate a memory. For example, the DIB can be configured to mimic the operation of a memory by receiving values to be stored from second device 120 and outputting values based on commands from second device 120. Emulating a memory, however, requires additional resources on the DIB and is relatively slow compared to an actual memory. Thus, this type of testing often does not provide an indication as to how second device 120 will perform in operation.

III. Exemplary Embodiments

In embodiments described herein, an interposer for testing devices is provided. In an embodiment, the interposer includes a substrate, a first plurality of connection elements located on a surface of substrate, and a memory device electrically coupled to the first plurality of connection elements. The first plurality of connection elements can be configured to mate with a second plurality of connection elements located on a device under test. During testing, the memory device can be configured to store information received from the device under test and to output stored information to the device under test.

Thus, the interposer can allow for real world testing of a device with an actual memory. For example, in an embodiment, the device under test is a memory controller. In such an embodiment, the interposer can allow the memory controller to be tested with an actual memory. In doing so, the memory controller's operation is tested at the high speeds of an actual memory, where these high speeds cannot be produced by an emulator. This high speed testing also decreases the test time. Moreover, in the embodiment in which the device under test includes connection elements on two opposite surfaces (e.g., like second device 120), using the interposer described herein can free a DIB from having to route signals from both sets of connection elements. This can, for example, allow for high-frequency testing of the device (e.g., by eliminating long signal paths).

In an embodiment, the interposer can be used for automated testing of devices allowing rapid testing without human intervention. For example, the substrate of the interposer can include an opening that passes completely through the substrate. The opening can be sized to accommodate a suction cup. The suction cup can be used to adhere to a surface of a device under test such that the second plurality of connection elements located on the device under test mate with the first plurality of connections elements on the surface of the substrate. Moreover, the interposer can be included in an actuator of a testing system. The actuator can be controlled to automatically move devices into test socket(s) and to move them to different locations after testing.

Moreover, to allow for the suction cup to pass through the substrate, the memory of the interposer can be offset with respect to the device under test. As will be described below, in different embodiments, the memory can be located on the same surface as the first plurality of connection elements, on the opposite surface, or embedded within the substrate.

Figure 2:
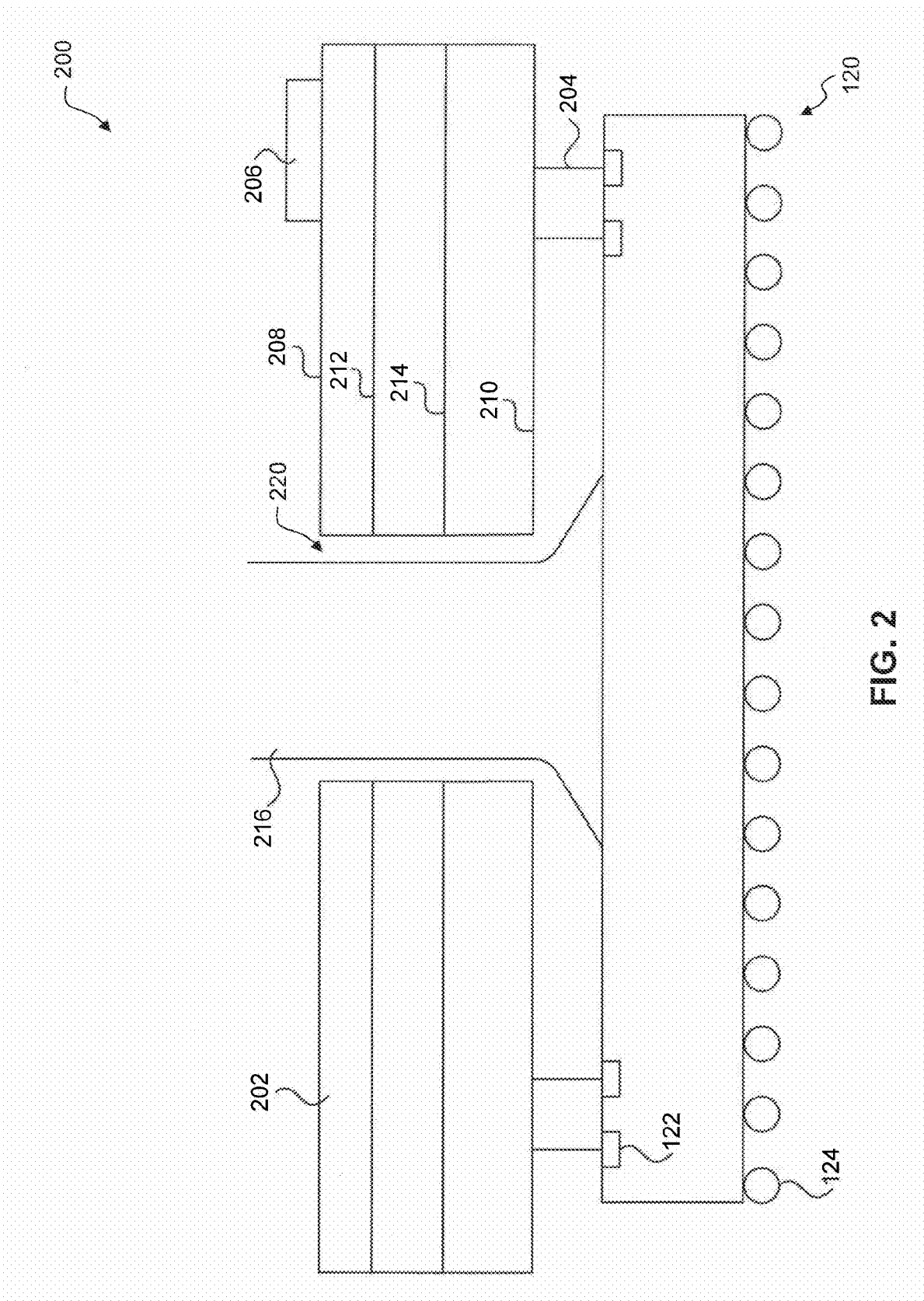
FIGS. 2-4 show cross-sectional diagrams of interposers, according to embodiments.

FIG. 2 shows a cross-sectional diagram of an interposer 200, according to an embodiment. Interposer 200 can be used in testing of devices. For example, in embodiment of FIG. 2, second device 120 is shown as being the device under test.

Interposer 200 includes a substrate 202, a plurality of interconnection elements 204, a memory 206, and a suction cup 216. Substrate 202 can include layers of dielectric material separated by patterned, electrically-connective layers. For example, in FIG. 2, substrate 202 includes embedded layers 212 and 214 that can be patterned. In a further embodiment, first and second surfaces 208 and 210 of substrate 202 are surfaces of patterned, electrically-conductive layers. In an embodiment, substrate 202 can be used to route signals. For example, the patterns included in surfaces 208 and 210 and in layers 212 and 214 can include traces that route signals. In a further embodiment, substrate 202 includes one or more vias that electrically coupled different layers of substrate 202 (not shown in FIG. 2).

Substrate 202 can be formed out of layers of dielectric material separated patterned layers of electrically conductive material. The dielectric material can be FR-4 or other dielectric materials known to those skilled in the art. In the embodiment of FIG. 2, substrate 202 is shown as including three layers of dielectric material and four layers of electrically conductive material. However, in alternate embodiments, different numbers of layers of dielectric and conductive material can be used. Moreover, the electrically conductive material can be one of a variety of different electrically conductive materials known to those skilled in the relevant art (e.g., copper or aluminum).

Plurality of connection elements 204 are located on surface 210 of substrate 202. As shown in FIG. 2, plurality of connection elements 204 can be configured to mate with respective ones of plurality of connection elements 122 of second device 120. Thus, plurality of connection elements 204 can be used to establish an electrical connection between interposer 200 and the device under test, e.g., second device 120.

As shown in FIG. 2, the plurality of connection elements 204 is implemented as a plurality of pins. However, in alternate embodiments, other connection elements can be included, e.g., pads or solder balls.

Memory 206 is coupled to surface 208 of substrate 202. In an embodiment, memory 206 is electrically coupled to plurality of connection elements 204 through substrate 202. For example, in an embodiment, metal layers and/or one or more vias of substrate 202 can be used to establish an electrical interconnection between plurality of connection elements 204 and memory 206. Thus, during testing of second device 120, an electrical connection can be made between second device 120 and memory 206. This allows for testing of real world operation of second device 120. For example, the operation of the device under test (second device 120 in the embodiment of FIG. 2) can be tested with memory 206, as opposed to emulating the operation of a memory using a DIB.

In the embodiment of FIG. 2, memory 206 is bonded directly to surface 208 of substrate 202. In other embodiments, however, memory 208 can be housed in a package which is then mounted to surface 208. In an embodiment, memory 206 is a high-speed memory, e.g., a high-speed dynamic random access memory (DRAM). In alternate embodiments, however, other types of memories can be used.

Suction cup 216 passes through an opening 220 in substrate 200. Suction cup 216 can be used to adhere to the top surface of second device 120. For example, as shown in FIG. 2, suction cup 216 can be used to adhere to the top surface of second device 120 such that an electrical connection is established by mating plurality of connection elements 204 with plurality of connection elements 122. Suction cup 216 can allow for automated testing of devices because it can acquire a device to be tested without human intervention.

As shown in FIG. 2, memory 206 is offset from device 120 to accommodate suction cup 216. For example, the center of memory 206 is offset from a center of second device 120 to allow for suction cup 216 to make contact with the central region of a top surface of second device 120.

Figure 3:
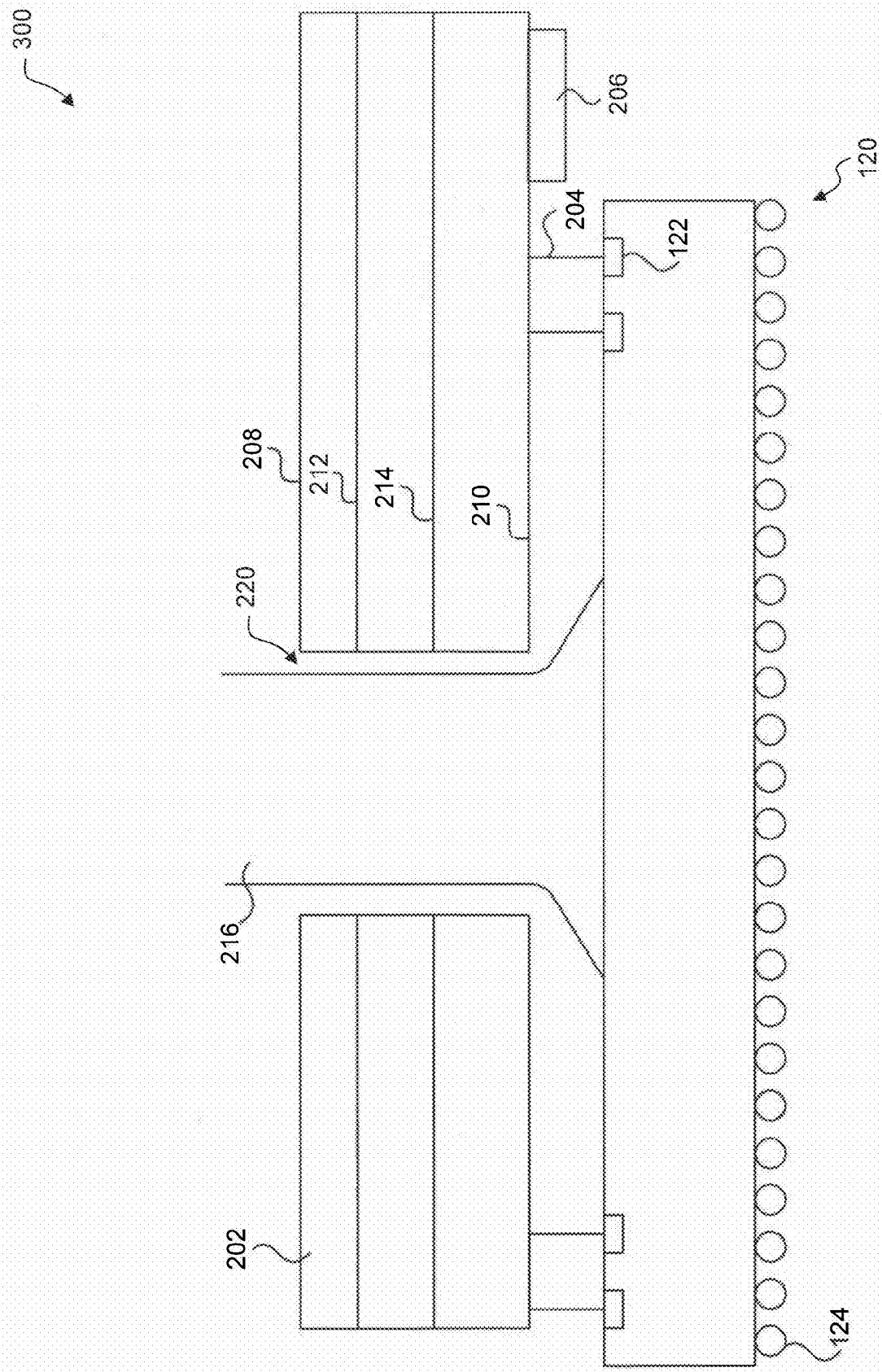

FIG. 3 shows a cross-sectional diagram of an interposer 300, according to an embodiment. Interposer 300 is substantially similar to interposer 200, described with reference to FIG. 2, except that memory 206 is coupled to surface 210 of substrate 202. In an embodiment, coupling memory 206 to surface 210 of substrate 202 may decrease the length of connections between memory 206 and plurality of connection elements 204. However, coupling memory 206 to surface 210 also may require an increase in the surface area of surface 210. For example, as shown in FIG. 3, surface 210 is required to accommodate plurality of connection elements 204, suction cup 216, and memory 206.

Figure 4:
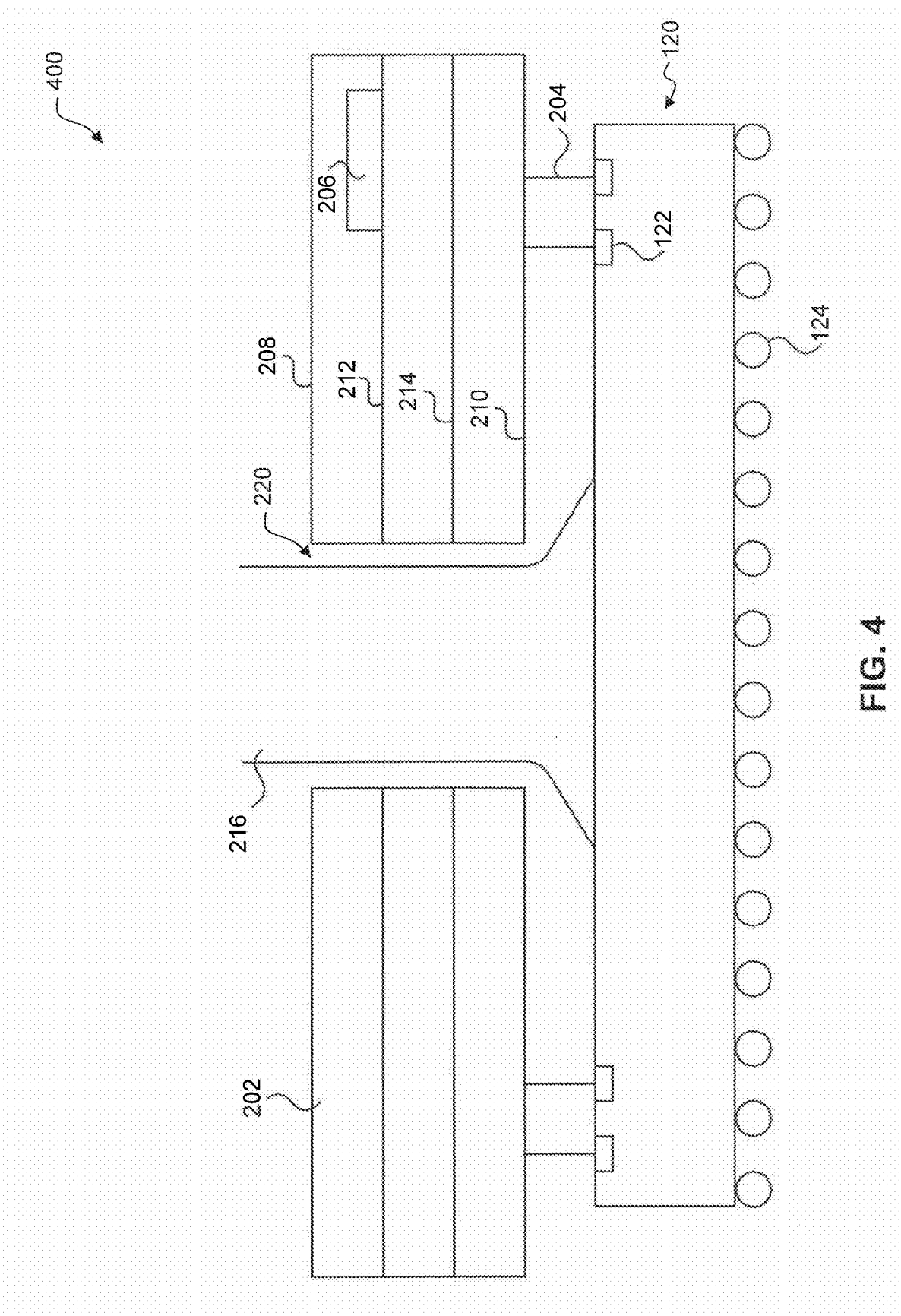

FIG. 4 shows a cross-sectional diagram of an interposer 400, according to an embodiment. As shown in FIG. 4, interposer 400 is substantially similar to interposer 200, described with reference to FIG. 2, except that memory 206 is embedded in substrate 200. Memory 206 is coupled to metal layer 212 of substrate 200.

In an embodiment, embedding memory 206 within substrate 202 can increase the area on surfaces 208 and 210 that is available for other elements. Moreover, removing memory 206 from surface 208 can facilitate attaching interposer 400 to an actuator arm. The use of an interposer in an actuator arm will be described in greater detail below with respect to FIG. 7.

Figure 5:
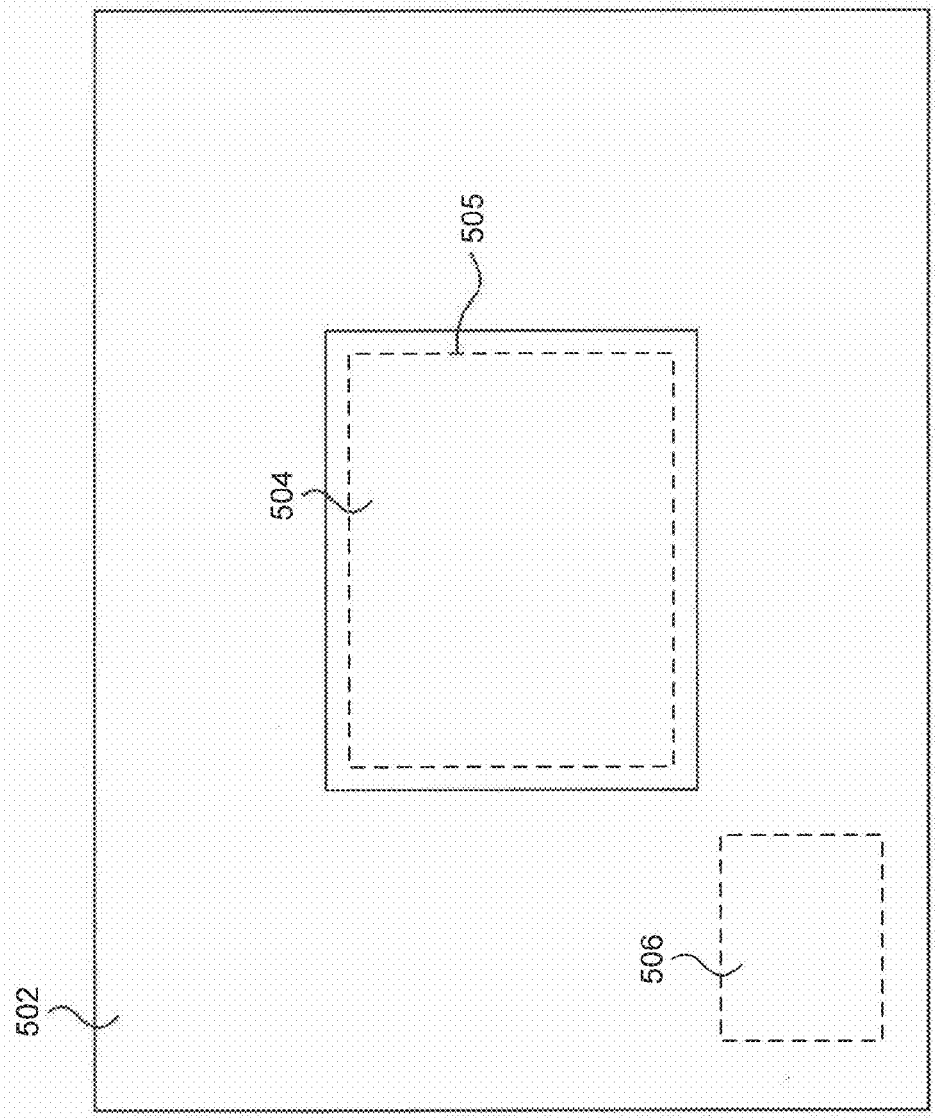
FIG. 5 shows a top view of an interposer, according to an embodiment.

FIG. 5 shows a top view of an interposer 500, according to an embodiment. In an embodiment, interposer 500 can be substantially similar to interposers 200, 300, or 400. Interposer 500 includes a substrate 502 that includes an opening 504, which that passes completely through substrate 502. In an embodiment, opening 504 can be configured to accommodate a suction cup. in the embodiment of FIG. 5, opening 504 is shown to have a square shape. However, in alternate embodiments opening 504 can have different shapes. For example, the shape of opening 504 can change with the shape of the suction cup to best accommodate the suction cup. The placement of a suction cup through opening 504 is indicated in FIG. 5 with dotted lines 505.

Moreover, as shown in FIG. 5, interposer 500 also includes a memory 506. Memory 506 is shown in FIG. 5 with dotted lines because, as noted above, it can be located in a number of different regions of a substrate of interposer. For example, memory 506 can be located on the top surface of the interposer, e.g., as shown in FIG. 2, on the bottom surface on the interposer, e.g., as shown in FIG. 3, or embedded within the substrate, e.g., as shown in FIG. 4.

Figure 6:
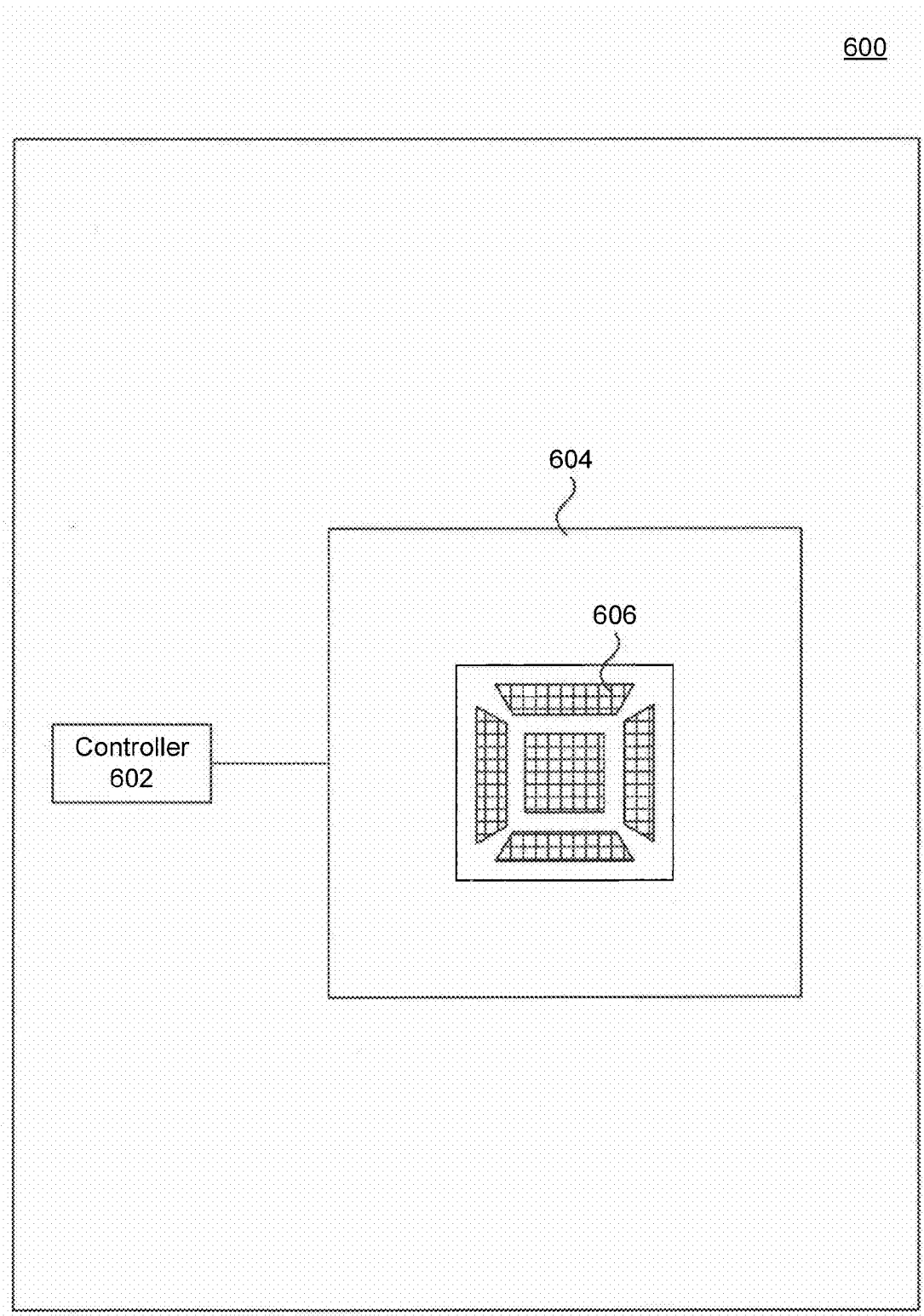
FIG. 6 shows a top view of a device interface board (DIB), according to an embodiment.

FIG. 6 shows a top view of a device interface board (DIB) 600, according to an embodiment. DIB 600 includes a controller 602, coupled to one or more test sockets 604. In the embodiment of FIG. 6, one test socket 604 is shown for the purposes of illustration only. In other embodiments, however, additional test sockets can also be included in DIB 600. The additional test sockets can also be coupled to controller 602 or can each be coupled to respective controllers. In still another embodiment, groups of test sockets are coupled to a respective controller.

Test socket 604 includes connection elements 606. In an embodiment, connection elements 606 are configured to mate with connection elements of a device under test to establish an electrical connection between test socket 604 and the device under test. In the embodiment of FIG. 6, connection elements 606 are shown to be pads. In other embodiments, however, connection elements 606 can include other types of connection elements, e.g., pins or solder balls.

FIG. 7 shows a cross-sectional diagram of an actuator 700, according to an embodiment. Actuator 700 includes an actuator arm 702 and interposer 400. As noted above, interposer 400 can be used to facilitate testing of a device under test. Moreover, as would be appreciated by those skilled in the art, interposer 400 is used here for illustration purposes only. In alternate embodiments, actuator 700 can instead include other interposers, e.g., interposers 200 or 300.

In an embodiment, DIB 600 and actuator 700 can together form a system that can be used to test devices. For example, actuator 700 can be controlled by controller 602 to acquire a device under test and place it on test socket 604 such that connection elements of the device under test mate with connection elements 606 of test socket 604. Controller 602 can then perform testing of the device. The operation of controller 602 will be described in further detail with regard to the flowchart shown in FIG. 8.

Figure 9:
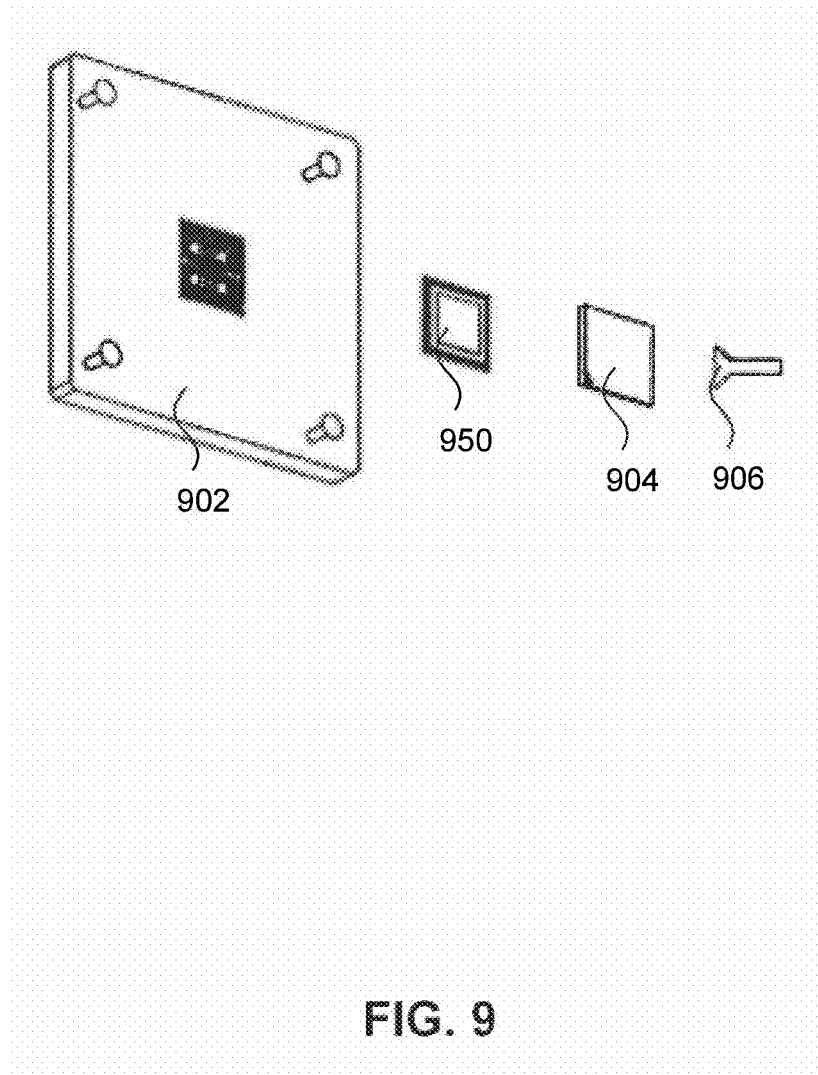
FIGS. 9 and 10 show isometric views of aspects of system for testing devices, according to embodiments.
Figure 10:
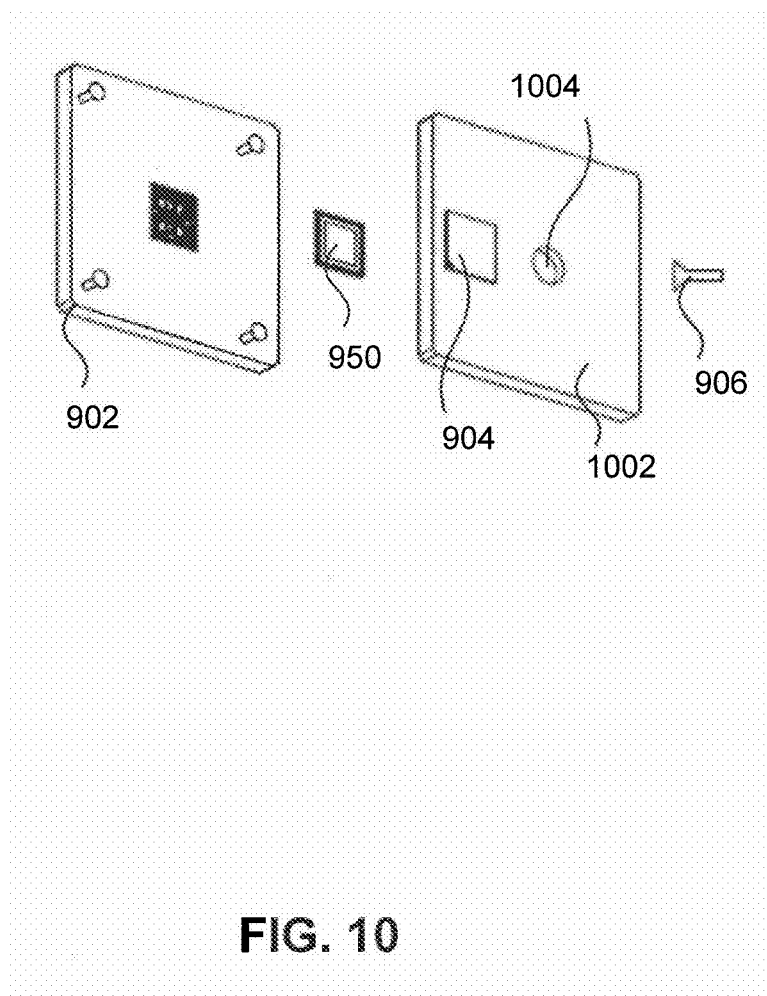

FIGS. 9 and 10 show isometric views of aspects of a system for testing devices, according to embodiments. For example, FIG. 9 shows an isometric view showing a test socket 902, a memory 904, a suction cup 906, and a device under test 950. Suction cup 906 can be controlled to adhere to device under test 950 so that an actuator (not shown in FIG. 9) can place device under test 950 into test socket 902. Test socket 902 can be used to establish an electrical connection with device under test 902 to allow for testing. Memory 904 can be included in an interposer and used during the testing of device under test 950.

FIG. 10 shows an isometric view showing test socket 902, memory 904, suction cup 906, device under test 950, and an interposer 1002. As shown in FIG. 10, memory 904 can be located on the top surface of interposer 1002 and can be offset with respect to device under test 950. Interposer 1002 includes an opening 1004 that is configured to accommodate suction cup 906. For example, as shown in FIG. 10, opening 1004 has a circular opening to match the shape of suction cup 906.

Figure 8:
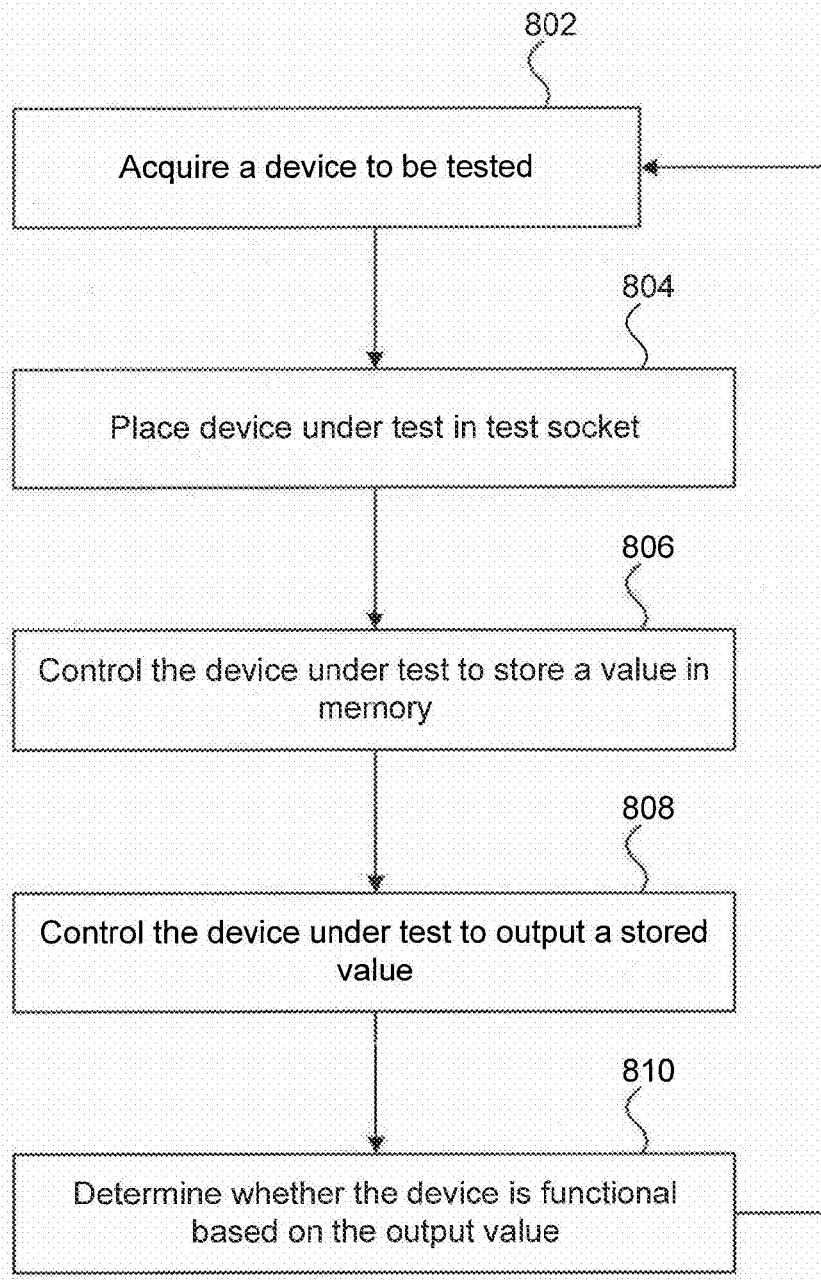
FIG. 8 is flowchart of a method of testing a device, according to an embodiment.

FIG. 8 shows a flowchart depicting a method 800 for testing a device, according to some embodiments of the disclosed subject matter. Not all steps of method 800 may be required, nor do all of the steps shown in FIG. 8 necessarily have to occur in the order shown.

In step 802, a device to be tested is acquired. For example, in the embodiments of FIGS. 6 and 7, controller 602 can control actuator 700 to acquire a device to be tested. For example, actuator 700 can use the suction cup of the respective interposer, e.g., interposer 400, to adhere to a device to be tested.

In step 804, the device under test is placed in the test socket. For example, in the embodiments of FIGS. 6 and 7, actuator 700 can be controlled by controller 602 to move the acquired device to test socket 604. In a further embodiment, controller 602 can control actuator 700 to place the device to be tested in test socket 604 such that interconnection elements of the device to be tested mate with connection elements 606 of test socket 604. For example, if the device to be tested is second device 120, controller 602 can control actuator 700 to place second device 120 in test socket 604 such that plurality of connection elements 124 mate with connection elements 606.

In step 806, the device under test is controlled to store a value in memory. For example, in the embodiments of FIGS. 6 and 7, controller 602 can control test socket 604 to send a signal to the device under test (using plurality of connection elements 606) that commands the device to store a value in a memory. For example, in an embodiment, the memory in which this value is stored may be a memory that is included in interposer of the actuator. For example, with reference to FIG. 7, the device under test can be instructed to store a value in memory 206 of interposer 400.

In step 808, the device is controlled to output a stored value. For example, in an embodiment, controller 602 can control a test socket 604 to send a signal through a plurality of connection elements 606 to the device under test to instruct the device to retrieve a value from the memory and output that value to controller 602. For example, with reference to FIG. 7, the device under test can be instructed to retrieve a value from memory 206 and output that value to controller 602. In an embodiment, the value output in step 808 can be the same as or different from the value stored in step 806.

In a further embodiment, a testing procedure can include a number of different steps, e.g., computations done by the device under test. Such a testing procedure can include controlling the device to store a value in memory and to output the stored value to test the operation of the interaction between the device and a memory. Additionally or alternatively, steps 806 and 808 may be repeated a number of different times during the testing process.

In step 810, it is determined whether the devices are functional based on the outputted value. For example, with reference to FIG. 6, controller 602 can be configured to determine whether the device under test is functional based on the outputted value. For example, control 602, can be configured to compare the outputted value to a locally stored value to determine whether the device under test is correctly operating with the memory.

After the test for the device is complete, as shown in FIG. 8, flowchart 800 returns to step 802 and another device is tested. Thus, testing using a real world memory can be done automatically without human interaction to use of the embodiments described herein.

It is to be appreciated that the Detailed Description section, and not the Abstract section, is intended to be used to interpret the claims. The Abstract section can set forth one or more, but not all exemplary embodiments, of the disclosure, and thus, are not intended to limit the disclosure and the appended claims in any way.

The disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

It will be apparent to those skilled in the relevant art(s) that various changes in form and detail can be made therein without departing from the spirit and scope of the disclosure. Thus the disclosure should not be limited by any of the above-described exemplary embodiments, but should be defined only in accordance with the following claims and their equivalents.

What is claimed is:

1. An interposer for testing devices, comprising:
   a substrate;
   a first plurality of connection elements located on a surface of the substrate; and
   a memory device electrically coupled to the first plurality of connection elements through the substrate,
   wherein the first plurality of connection elements is configured to mate with a second plurality of connection elements located on a device under test,
   wherein the memory device is configured to store information received from the device under test and to output stored information to the device under test, and wherein the memory device is embedded within the substrate.

2. An interposer for testing devices, comprising:
   a substrate;
   a first plurality of connection elements located on a surface of the substrate; and
   a memory device electrically coupled to the first plurality of connection elements through the substrate,
   wherein the first plurality of connection elements is configured to mate with a second plurality of connection elements located on a device under test,
   wherein the memory device is configured to store information received from the device under test and to output stored information to the device under test,
   wherein the substrate has an opening that passes completely through the substrate, and wherein the opening is configured to accommodate a suction cup.

3. The interposer of claim 1, wherein the first plurality of connection elements and the memory device are located on opposite surfaces of the substrate.

4. The interposer of claim 1, wherein the first plurality of connection elements and the memory device are located on a same surface of the substrate.

5. The interposer of claim 1, wherein the first plurality of connection elements comprises a plurality of pins.

6. The interposer of claim 1, wherein the device under test is a memory controller.

7. A system for testing devices, comprising:
   an actuator having an interposer, the interposer comprising:
      a substrate;
      a first plurality of connection elements located on a surface of the substrate; and
      a memory device electrically coupled to the first plurality of connection elements through the substrate,
      wherein the first plurality of connection elements is configured to mate with a second plurality of connection elements located on a device under test; and
   a device interface board, comprising:
      a test socket configured to receive the device under test; and
      a controller electrically coupled to the test socket, wherein the controller is configured to control the device under test to store information in the memory device and to output stored information received from the memory device.

8. The system of claim 7, wherein the first plurality of connection elements and the memory device are located on opposite surfaces of the substrate.

9. The system of claim 7, wherein the first plurality of connection elements and the memory device are located on a same surface of the substrate.

10. The system of claim 7, wherein the second plurality of connection elements comprises a plurality of pins.

11. The system of claim 7, wherein the device under test is a memory controller.

12. The system of claim 7, wherein the controller is further configured to perform automated testing of the device under test.

13. The system of claim 7, wherein the test socket comprises a third plurality of connection elements configured to mate with a fourth plurality of connection elements located on the device under test.

14. The system of claim 13, wherein the first and fourth pluralities of connection elements are located on opposite sides of the device under test.

15. The system of claim 7, wherein the memory device is embedded in the substrate.

16. The system of claim 7, wherein the substrate has an opening that passes completely through the substrate, the system further comprising:
   a suction cup located in the opening of the substrate, wherein the suction cup is configured to adhere to a surface of the device under test such that the first plurality of connection elements mates with the second plurality of connection elements.

* * * * *